(12) United States Patent
Tomita et al.

(10) Patent No.: US 8,299,523 B2
(45) Date of Patent: Oct. 30, 2012

(54) SEMICONDUCTOR DEVICE

(75) Inventors: Kouta Tomita, Hyogo-ken (JP); Noboru Matsuda, Hyogo-ken (JP); Hideyuki Ura, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/195,579

(22) Filed: Aug. 1, 2011

(65) Prior Publication Data

US 2012/0025306 A1 Feb. 2, 2012

(30) Foreign Application Priority Data

Aug. 2, 2010 (JP) .................. 2010-173502

(51) Int. Cl.
*H01L 29/76* (2006.01)
*H01L 31/062* (2012.01)
(52) U.S. Cl. ......... 257/330; 257/329; 257/341; 438/270
(58) Field of Classification Search .......... 257/329–330, 257/341, E29.262, E21.41; 438/270
See application file for complete search history.

(56) References Cited

U.S. PATENT DOCUMENTS

| 6,825,510 | B2 | 11/2004 | Probst |
| 6,921,699 | B2 | 7/2005 | Ma et al. |
| 2006/0157813 | A1* | 7/2006 | Saito et al. ............ 257/498 |
| 2008/0073710 | A1* | 3/2008 | Yamamoto ............. 257/334 |
| 2011/0140197 | A1 | 6/2011 | Tomita et al. |

FOREIGN PATENT DOCUMENTS

JP 2009-505434 2/2009
WO WO-2007/022370 2/2007

\* cited by examiner

*Primary Examiner* — Theresa T Doan
(74) *Attorney, Agent, or Firm* — Patterson & Sheridan, LLP

(57) ABSTRACT

In general, according to one embodiment, a semiconductor device includes a first electrode, a first and a second semiconductor layer of a first conductivity type, a third semiconductor layer of a second conductivity type, a fourth semiconductor layer of the first conductivity type in this order. A device region includes a gate electrode inside a first trench. A second trench having a ring-shaped structure forms a first region penetrating through the fourth and third semiconductor layers to the second semiconductor layer and including the device region inside and a second region surrounding the first region outside. A first opening is provided between adjacent ones of the first trenches. A second opening having a wider width than the first opening is provided in the first region outside the device region. A second electrode is electrically connected to the third and fourth semiconductor layers through the first and second openings.

20 Claims, 6 Drawing Sheets

US 8,299,523 B2

SEMICONDUCTOR DEVICE

CROSS-REFERENCE TO RELATED APPLICATIONS

This application is based upon and claims the benefit of priority from the prior Japanese Patent Application No. 2010-173502, filed on Aug. 2, 2010; the entire contents of which are incorporated herein by reference.

FIELD

Embodiments described herein relate generally to a semiconductor device.

BACKGROUND

A power MOSFET (Metal Oxide Semiconductor Field Effect Transistor) includes a device region in which a current flows, and a termination region formed in the outer peripheral portion of the chip around the device region. In the termination region of the device, if the depletion layer extends to the chip end portion, leakage current flows in the chip end portion and results in device breakdown. To prevent this, the base layer and the source layer need to be terminated in the device region. To form this structure requires extra manufacturing steps for forming masks patterned in conformity with respective regions where the base layer and the source layer are to be formed. To suppress the manufacturing cost, it is desired to eliminate these mask formation steps.

BRIEF DESCRIPTION OF THE DRAWINGS

FIG. 1A is a sectional view of the main part, FIG. 1B is a top view of the main part, and FIG. 1C is another sectional view of the main part;

FIG. 2A is a sectional view of the main part, FIG. 2B is a top view of the main part;

FIG. 3A is a sectional view of the main part, FIG. 3B is a top view of the main part;

FIG. 4A is a sectional view of the main part, FIG. 4B is a top view of the main part;

FIG. 5A is a sectional view of the main part, FIG. 5B is a top view of the main part; FIG. 6A is a sectional view of the main part, FIG. 6B is a top view of the chip.

DETAILED DESCRIPTION

Figure 1A:
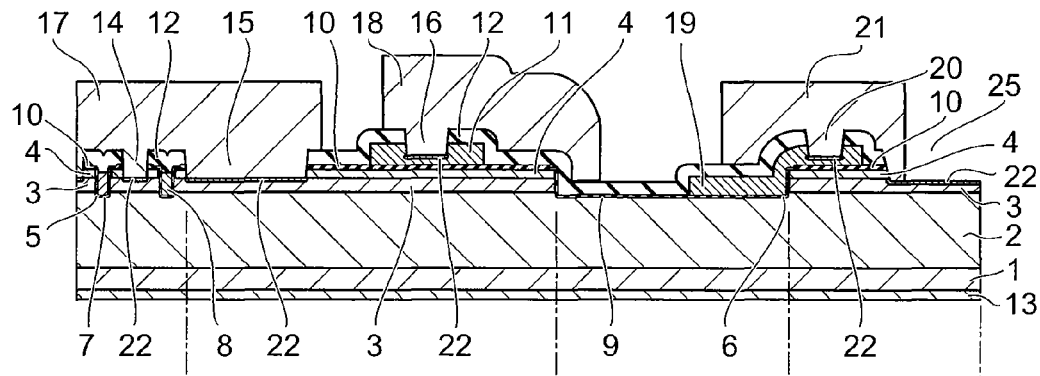
FIGS. 1A to 1C are schematic views of the main part of a semiconductor device according to a first embodiment.

In general, according to one embodiment, a semiconductor device includes a first semiconductor layer of a first conductivity type, a second semiconductor layer of the first conductivity type, a third semiconductor layer of a second conductivity type, a fourth semiconductor layer of the first conductivity type, a first insulating film, a gate electrode, a second insulating film, a third insulating film, a gate interconnect layer, an interlayer insulating film, a first electrode and a second electrode. The second semiconductor layer of the first conductivity type is provided on the first semiconductor layer and has a lower first conductivity type impurity concentration than the first semiconductor layer. The third semiconductor layer of a second conductivity type is provided on the second semiconductor layer. The fourth semiconductor layer of the first conductivity type is provided on the third semiconductor layer and has a higher first conductivity type impurity concentration than the second semiconductor layer. The first insulating film is provided on an inner wall of each of a plurality of first trenches. The first trenches penetrate through the fourth semiconductor layer and the third semiconductor layer to the second semiconductor layer and extend in a first direction parallel to a surface of the first semiconductor layer. The gate electrode is buried in the each of the plurality of first trenches via the first insulating film. The second insulating film is provided on an inner wall of a second trench having a ring-shaped structure. The second trench penetrate through the fourth semiconductor layer and the third semiconductor layer to the second semiconductor layer and include a portion extending in the first direction. The portion divides each of the third semiconductor layer and the fourth semiconductor layer between a first region and a second region. The first region includes a device region inside, the device region includes the gate electrode in a plurality, and the second region surrounds the first region outside. The third insulating film is provided on the fourth semiconductor layer in the first region and the second region, connected to the first insulating film and the second insulating film, and insulates the fourth semiconductor layer from outside. The gate interconnect layer is provided on the third insulating film in the first region, surrounds the device region, and electrically connected to the gate electrode at both ends of the each of the first trenches. The interlayer insulating film is provided on the gate electrode, the gate interconnect layer, the second trench, and the third insulating film and insulates the gate electrode and the gate interconnect layer from outside. The first electrode is provided on a surface of the first semiconductor layer opposite to the second semiconductor layer. The second electrode is electrically connected to the third semiconductor layer and the fourth semiconductor layer through a first opening and a second opening. The first opening penetrates through the interlayer insulating film, the third insulating film, and the fourth semiconductor layer between adjacent ones of the first trenches, and the second opening penetrates through the interlayer insulating film, the third insulating film, and the fourth semiconductor layer and extends in the first direction between the gate interconnect layer and one of the plurality of first trenches adjacent to the gate interconnect layer in a second direction orthogonal to the first direction.

In the second direction, width of the second opening is wider than width of the first opening.

Various embodiments will be described hereinafter with reference to the accompanying drawings. The figures used in describing the embodiments are schematic for ease of description. In actual practice, the shape, dimension, and size relation of components in the figures are not necessarily identical to those shown in the figures, and can be suitably modified as long as the effect of the invention is achieved. Although it is assumed in this description that the first conductivity type is n-type and the second conductivity type is p-type, these conductivity types can be interchanged. Although silicon is taken as an example of semiconductor, the embodiments are also applicable to compound semiconductors such as SiC and GaN. Although silicon oxide film is taken as an example of insulating film, it is also possible to use other insulators such as silicon nitride film, silicon oxynitride film, and alumina. In the case where the conductivity type of n-type is denoted by $n^+$, n, and $n^-$, it is assumed that the n-type impurity concentration decreases in this order. Also with regard to p-type, it is assumed that the p-type impurity concentration decreases in the order of $p^+$, p, and $p^-$.

(First Embodiment)

Figure 1B:
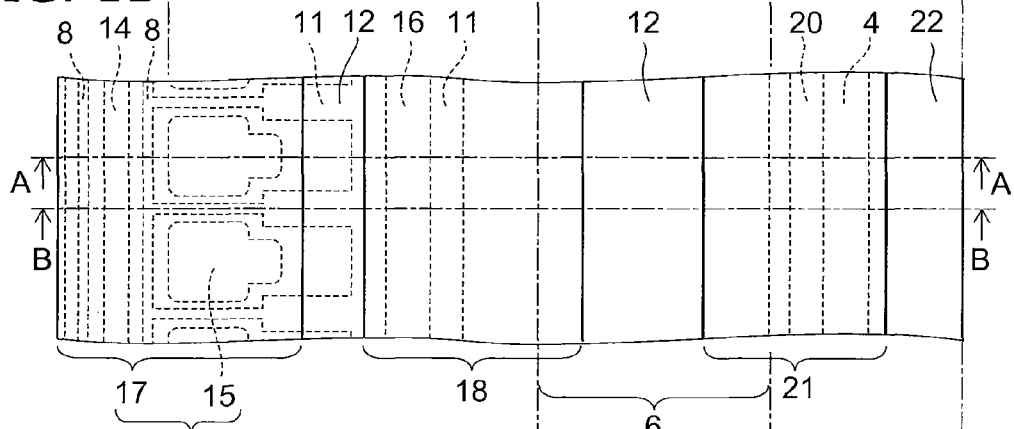
Figure 1C:
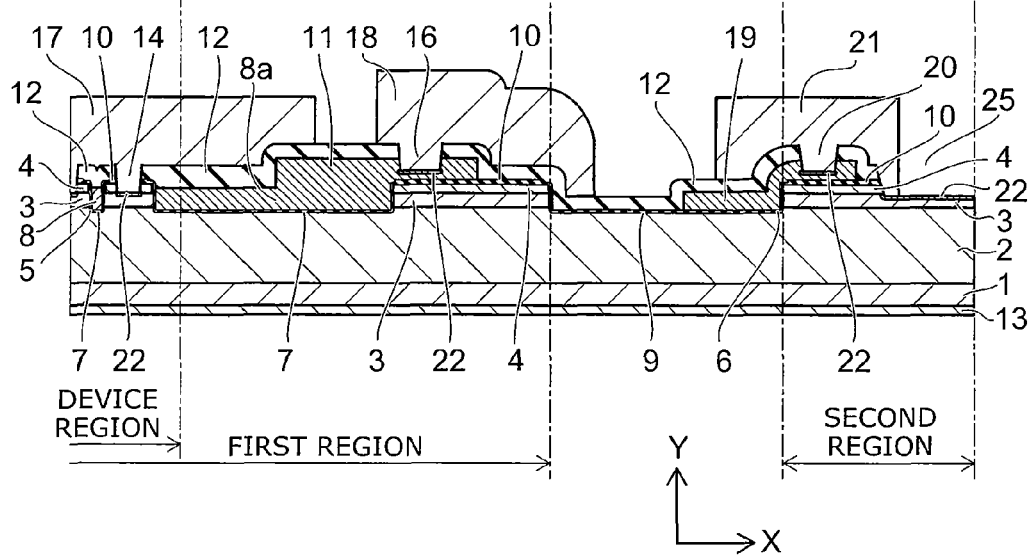

A first embodiment is described with reference to FIGS. 1A to 1C. FIGS. 1A to 1C are schematic views of the main part of a semiconductor device 100 according to the embodiment. More specifically, FIG. 1A is a sectional view of the main part of the semiconductor device 100. FIG. 1B is a top view of the main part of the semiconductor device. The cross section taken along line A-A of FIG. 1B is shown in FIG. 1A. FIG. 1C is a sectional view taken along line B-B of FIG. 1B. In the top view of FIG. 1B, one direction from the center to an end portion of the semiconductor device 100 is defined as X direction (second direction). The direction orthogonal thereto is defined as Y direction (first direction). This also applies to the following embodiments.

As shown in FIGS. 1A to 1C, the semiconductor device 100 includes first to fourth semiconductor layers. In plan view, the semiconductor device 100 includes a device region formed from gate electrodes provided in first trenches, a first region including this device region therein, and a second region separated from this first region by a second trench. The first to fourth semiconductor layers are made of silicon. On an $n^+$-type drain layer 1 (first semiconductor layer), an $n^-$-type drift layer 2 (second semiconductor layer) having a lower n-type impurity concentration than the $n^+$-type drain layer 1 is provided. On the $n^-$-type drift layer 2, a p-type base layer 3 (third semiconductor layer) is provided. On the p-type base layer 3, an $n^+$-type source layer 4 (fourth semiconductor layer) having a higher impurity concentration than the $n^-$-type drift layer 2 is provided.

The first trench is provided from the surface of the $n^+$-type source layer 4 through the $n^+$-type source layer 4 and the p-type base layer 3 to the $n^-$-type drift layer 2. The first trench 5 extends like a stripe e.g. in the Y direction in the figure. A plurality of first trenches 5 are formed along the X direction. On the inner wall of the first trench 5, a first insulating film 7 functioning as a gate insulating film 7 is formed. As an example, the gate insulating film 7 is a thermal oxide film formed by thermal oxidation of silicon at the inner wall of the first trench. However, the gate insulating film 7 is not limited to thermal oxidation, but may be a silicon oxide film formed by e.g. CVD. A gate electrode 8 is buried in the first trench 5 via the gate insulating film 7. The gate electrode 8 is made of e.g. polysilicon. Thus, the gate electrode 8 extends like a stripe in the Y direction, and a plurality of gate electrodes 8 are provided along the X direction. The region including the gate electrodes 8 constitutes the device region described later. In this device region, the gate electrode controls the current flowing from a drain electrode (first electrode) toward a source electrode (second electrode).

A second trench 6 having a ring-shaped structure is formed around the first region from the surface of the $n^+$-type source layer 4 through the $n^+$-type source layer 4 and the p-type base layer 3. The second trench 6 is formed so that the $n^+$-type source layer 4 and the p-type base layer 3 are each separated between the first region including the device region inside and the second region surrounding the first region at its outer periphery. That is, in plan view, the first region is formed inside the second trench 6, and the second region is formed outside the second trench 6. Between the first region and the second region, the $n^+$-type source layer 4 and the p-type base layer 3 are each spaced and separated by the second trench. Because the device region is formed inside the first region, the device region can be regarded as part of the first region. The outside of the device region is referred to as termination region. The first region except the device region, and the second region constitute the termination region. In the termination region, the p-type base layer 3 and the $n^+$-type source layer 4 are terminated by the second trench 6.

The second trench is formed integrally with the first trench. This can eliminate extra lithography steps and etching steps. Like the gate insulating film 7 of the first trench 5, a second insulating film 9 is formed on the inner wall of the second trench 6 by thermal oxidation. This can be performed integrally with the step of forming the gate insulating film 7 in the first trench 5. Thus, the process steps can be reduced.

A third insulating film 10 is provided over the upper surface of the $n^+$-type source layer 4 in the device region, the first region, and the second region. The third insulating film 10 is connected to the gate insulating film 7 formed on the inner wall of the first trench 5 and the second insulating film 9 formed on the inner wall of the second trench 6. Thus, the third insulating film 10 insulates the $n^+$-type source layer 4 from outside. The third insulating film 10 can also be a silicon oxide film formed by thermal oxidation or CVD, like the gate insulating film 7 and the second insulating film 9. The third insulating film 10 is formed thicker than the gate insulating film 7 and the second insulating film 9. This can increase the breakdown voltage for the gate interconnect layer 11 and the channel stopper layer 19 described below.

A gate interconnect layer 11 is provided via the third insulating film 10 on the $n^+$-type source layer 4 in the first region located between the device region and the second trench 6. The gate interconnect layer 11 is formed around the device region. In a portion not shown, at both ends in the Y direction of the gate electrode 8, the gate interconnect layer 11 is electrically connected to each gate electrode 8. In plan view, as shown in FIG. 1B, the gate interconnect layer 11 includes a portion extending in the Y direction and, although not shown, a portion extending in the X direction. In the portion extending in the X direction, the gate interconnect layer 11 is connected at least electrically to both ends of the gate electrode 8.

A channel stopper layer 19 is provided via the second insulating film 9 and the third insulating film 10 from the bottom of the second trench to above the $n^+$-type source layer 4 in the second region. The channel stopper layer 19 is provided so as to cover the step difference portion (corner portion) located at the boundary between the second trench 6 and the second region. The gate interconnect layer 11 and the channel stopper layer 19 are made of polysilicon and formed integrally with the gate electrode 8.

An interlayer insulating film 12 made of silicon oxide film is provided on the gate electrode 8, on the third insulating film 10, on the gate interconnect layer 11, and on the channel stopper layer 19. The interlayer insulating film 12 insulates the gate electrode 8, the gate interconnect layer 11, and the channel stopper layer 19 from outside.

A trench-shaped first opening 14 is provided between the adjacent gate electrodes 8 in the device region. The first opening 14 penetrates through the interlayer insulating film 12, the third insulating film 10, and the $n^+$-type source layer 4 to the p-type base layer. A $p^+$-type contact layer 22 is provided on the surface of the p-type base layer exposed at the first opening.

A trench-shaped second opening 15 is provided adjacent to the second region side of the gate electrode 8 located nearest to the second region in the device region. The second opening 15 penetrates through the interlayer insulating film 12, the third insulating film 10, and the n$^+$-type source layer 4 to the p-type base layer 3. The second opening 15 is provided at the boundary between the device region and the termination region. A p$^+$-type contact layer 22 is provided on the surface of the p-type base layer 3 exposed at the second opening 15.

A trench-shaped gate interconnect opening 16 is provided so as to penetrate through the interlayer insulating film 12 to the inside of the gate interconnect layer 11. A p$^+$-type contact layer 22 is provided on the surface of the gate interconnect layer 11 exposed at the gate interconnect opening 16. A trench-shaped opening 20 is provided in the second region so as to penetrate through the interlayer insulating film 12 to the inside of the channel stopper layer 19. A p$^+$-type contact layer 22 is provided on the surface of the channel stopper layer 19 exposed at the opening 20.

An opening 25 is provided along the end portion of the chip of the semiconductor device 100, the end portion being the outermost peripheral portion of the second region. The opening 25 penetrates through the interlayer insulating film 12, the third insulating film 10, and the n$^+$-type source layer to the p-type base layer 3. At the opening 25, the end portion of the chip of the semiconductor device 100 is exposed. This opening is used as a dicing line when forming the chip of the semiconductor device 100. A p$^+$-type contact layer 22 is provided on the surface of the p-type base layer 3 exposed at the opening 25.

The first opening 14, the second opening 15, the gate interconnect opening 16, and the openings 20, 25 described above can be integrally formed. The p$^+$-type contact layers 22 provided on the portion exposed at the respective openings can be integrally formed by the same step of ion implantation and diffusion.

A drain electrode 13 (first electrode) is provided on the surface of the n$^+$-type drain layer 1 opposite to the n$^-$-type drift layer 2, and forms ohmic contact with the n$^+$-type drain layer 1.

A source electrode 17 (second electrode) is provided in contact with the p$^+$-type contact layer 22 through the first opening and the second opening. By ohmic contact with the p$^+$-type contact layer 22, the source electrode 17 is electrically connected to the p$^+$-type base layer 3. Here, the second opening is provided so as to have a larger width in the X direction than the first opening.

A gate metal interconnect layer 18 is provided in contact with the p$^+$-type contact layer 22 through the gate interconnect opening 16. By ohmic contact with the p$^+$-type contact layer 22, the gate metal interconnect layer 18 is electrically connected to the gate interconnect layer 11. The gate metal interconnect layer 18 extends from the gate interconnect opening 16 to the bottom of the second trench. The gate metal interconnect layer 18 is provided on the interlayer insulating film 12 so as to cover the step difference (corner portion) at the boundary between the first region and the second trench.

A channel stopper electrode 21 is provided in contact with the p$^+$-type contact layer 22 through the opening 20. By ohmic contact with the p$^+$-type contact layer 22, the channel stopper electrode 21 is electrically connected to the channel stopper layer 19. The channel stopper electrode 21 extends on the interlayer insulating film 12 from the opening 20 to the second trench. The channel stopper electrode 21 is provided so as to cover the step difference (corner portion) at the boundary between the second trench 6 and the second region. Furthermore, the channel stopper electrode 21 extends on the interlayer insulating film 12 from the opening 20 toward the chip end portion. The channel stopper electrode 21 is electrically connected to and forms ohmic contact with the p$^+$-type contact layer 22 exposed at the opening 25. On the chip end portion, a fracture layer exists as a result of dicing and is likely to provide electrical continuity. Thus, the channel stopper layer 19 is made equipotential to the drain electrode 13 through the channel stopper electrode 21, the p$^+$-type contact layer 22, and the chip end portion.

As shown in FIG. 1B, the spacing in the X direction between the second opening 15 and the second trench 6 includes a wide portion and a narrow portion alternately along the Y direction. In conformity therewith, the planar shape of the gate interconnect layer 11 is formed. The second opening 15 is divided into a plurality along the Y direction and composed of a plurality of divided portions. A gate extraction portion 8a is formed on each of both sides in the Y direction of each divided portion of the second opening 15. The gate extraction portion 8a is spaced and separated from each divided portion of the second opening 15. The gate extraction portion 8a is formed in the portion of the first trench 5 extending from the first trench 5 adjacent to the gate interconnect layer 11 toward the gate interconnect layer 11. The gate extraction portion 8a is the gate electrode buried in the portion of the first trench 5 via the gate insulating film 7. FIG. 1C shows a sectional view of the portion where the gate extraction portion 8a is connected to the gate interconnect layer 11. As shown in FIG. 1C, this gate extraction portion 8a is electrically connected to the gate interconnect layer 11 in the portion of wide spacing in the X direction between the second opening 15 and the second trench 6.

In the portion of narrow spacing in the X direction between the second opening 15 and the second trench 6, the second opening 15 includes a protrusion projected toward the second region in the X direction. In plan view, the shape of the gate interconnect layer 11 includes a depression recessed toward the second region in the X direction. The depression is opposed to the protrusion of the second opening 15 projected toward the second region in the X direction.

As described above, the semiconductor device 100 according to the embodiment is configured. Next, the operation and effect of this semiconductor device are described.

On the gate metal interconnect layer 18, a gate electrode pad is formed in a region not shown. This gate electrode pad is supplied with a gate voltage through e.g. a bonding wire. The supplied gate voltage is supplied to the gate electrode 8 in the device region through the gate interconnect layer 11. When the drain electrode 13 is placed at a positive voltage relative to the source electrode 17, if the gate voltage exceeds a threshold (hereinafter referred to as on-state), a current flows from the drain electrode to the source electrode.

When the gate voltage is less than or equal to the threshold (hereinafter referred to as off-state), the current from the drain electrode 13 to the source electrode 17 is blocked. At this time, by the voltage applied between the drain and the source, a depletion layer extends from the interface of the p-type base layer 3 and the n$^-$-type drift layer 2 toward the n$^-$-type drift layer 2. To prevent this depletion layer from extending to the dicing line of the chip end portion of the semiconductor device 100, the p-type base layer 3 needs to be terminated at the boundary between the first region and the second region. In general, by ion implantation and impurity diffusion of p-type impurity through a mask into the surface of the n$^-$-type drift layer 2, the p-type base layer 3 is formed only in the device region or its neighborhood.

However, in the embodiment, p-type impurity is ion implanted and diffused into the entire surface of the n$^-$-type drift layer 2 without using a mask. Thus, the p-type base layer 3 is formed on the entire surface of the n$^-$-type drift layer 2. Likewise, the n$^+$-type source layer 4 is also formed on the entire surface of the p-type base layer 3. To terminate the p-type base layer 3 and the n⁺-type source layer 4 at the periphery of the device region, the second trench is formed. Thus, the p-type base layer 3 and the n⁺-type source layer 4 are spaced and separated into the first region and the second region. As a result, the pn junction of the n⁻-type drift layer 2 and the p-type base layer 3 is reverse biased only in the first region, and not reverse biased in the second region. Thus, the termination region of the depletion layer is located in the lower portion of the second trench. To suppress the decrease of breakdown voltage due to electric field concentration in the termination region of the depletion layer, the gate metal interconnect layer 18 is formed not only in the gate interconnect opening 16 in electrical contact with the gate interconnect layer 11, but also on the interlayer insulating film 12 so as to extend to the bottom of the second trench 6. The gate metal interconnect layer 18 is formed so as to cover the end portion in the first region of the p-type base layer 3 via the interlayer insulating film 12. Thus, the termination region of the depletion layer is extended from the end portion in the first region of the p-type base layer 3 along the bottom of the second trench 6 toward the chip end portion. This increases the breakdown voltage in the termination region of the semiconductor device 100. To prevent the depletion layer from extending beyond the second trench 6 toward the chip end portion, the channel stopper layer 19 and the channel stopper electrode 21 are formed as described above in the chip end portion of the second region.

In the structure of the semiconductor device 100 according to the embodiment, the p-type base layer 3 and the n⁺-type source layer 4 are formed on the entire surface of the n⁻-type drift layer 2. The p-type base layer 3 and the n⁺-type source layer 4 are terminated by the second trench 6 penetrating through the p-type base layer 3 and the n⁺-type source layer 4 in the termination region. This can reduce the manufacturing steps.

If the drain-source voltage exceeds the breakdown voltage, avalanche breakdown occurs. Electrons generated by avalanche breakdown are ejected from the drain electrode 13 through the n⁺-type drain layer 1. In the device region, holes generated are carried from the p-type base layer 3 through the first opening 14 and ejected from the source electrode 17. In the first region outside the device region, holes are carried from the p-type base layer 3 through the second opening 15 and ejected from the source electrode 17. In the structure of the embodiment, the p-type base layer 3 and the n⁺-type source layer 4 are formed on the entire surface of the n⁻-type drift layer 2. The p-type base layer 3 and the n⁺-type source layer 4 are terminated by the second trench 6 penetrating through the p-type base layer 3 and the n⁺-type source layer 4 in the termination region. Thus, in the first region outside the device region, i.e., between the second trench 6 and the second opening 15, there is a parasitic transistor made of the n⁻-type drift layer 2, the p-type base layer 3, and the n⁺-type source layer 4. On this parasitic transistor, the gate interconnect layer 11 is formed via the third insulating film 10.

If the drain-source voltage applied to the termination region exceeds the breakdown voltage and causes avalanche, then between the second opening 15 in the first region and the second trench 6, avalanche-generated holes travel in the p-type base layer 3 immediately below the n⁺-type source layer 4 and are ejected from the second opening 15 to the source electrode. By potential drop due to the current produced by the holes, the pn junction of the p-type base layer 3 and the n⁺-type source layer 4 is forward biased, and the parasitic transistor is placed in the on-state. As a result, a large current flows in the termination region of the semiconductor device 100 through the drain electrode 13, the n⁺-type drain layer 1, the n⁻-type drift layer 2, the p-type base layer 3, the n⁺-type source layer 4, and the source electrode 17. Thus, the semiconductor device 100 is broken. As the distance in the p-type base layer 3 traveled by avalanche-generated holes becomes longer, the parasitic transistor is more likely to be turned on. Also in the device region, the aforementioned parasitic transistor is formed so as to sandwich the gate electrode 8. However, the traveling distance of avalanche-generated holes is extremely shorter than in the parasitic transistor in the termination region described above. Hence, the parasitic transistor is less likely to be turned on in the device region. To make the parasitic transistor in the termination region less likely to be turned on, the traveling distance of avalanche-generated holes to the source electrode needs to be made shorter between the second opening 15 and the second trench 6.

In the embodiment, by providing the following features, the traveling distance of avalanche-generated holes to the source electrode is made shorter. The second opening 15 located at the boundary between the device region and the termination region is formed so that the width of the second opening 15 in the X direction in the figure is wider than that of the first opening 14 in the device region. Thus, the spacing in the X direction between the second opening 15 and the second trench 6 is narrowed. This reduces the distance traveled by avalanche-generated holes in the p-type base layer 3 between the second opening 15 and the second trench 6. Hence, turn-on of the parasitic transistor can be suppressed. This improves the avalanche withstand capability in the termination region, and can suppress device breakdown in the termination region.

Furthermore, in the embodiment, the gate extraction portion 8a is buried via the first insulating film in the portion extending toward the gate interconnect layer 11 of the first trench 5 adjacent to the gate interconnect layer 11. A plurality of gate extraction portions 8a are spaced and separated along the Y direction. The second opening 15 is formed from a plurality of divided portions spaced and separated along the Y direction. On each of both sides in the Y direction (above and below in the figure) of each divided portion of this second opening 15, the gate extraction portion 8a is spaced from the divided portion, extends toward the gate interconnect layer 11, and is electrically connected to the gate interconnect layer 11. The plurality of gate extraction portions 8a can reduce the gate resistance between the gate interconnect layer 11 and the first trench 5 adjacent thereto.

Furthermore, in the embodiment, the spacing in the X direction between the second opening 15 and the second trench 6 includes a wide portion and a narrow portion alternately along the Y direction. In conformity therewith, the gate interconnect layer 11 also includes, with regard to the width in the X direction, a wide portion and a narrow portion alternately along the Y direction. In this wide portion, the gate extraction portion 8a is electrically connected to the gate interconnect layer 11. In the portion of narrow spacing in the X direction between the second opening 15 and the second trench 6, each of the plurality of divided portions divided along the Y direction of the second opening 15 includes a protrusion toward the second region in the X direction. In conformity with this protrusion, the gate interconnect layer 11 includes a depression recessed toward the second region in the X direction. Thus, the second opening 15 includes a portion having a wide width in the X direction due to the protrusion, and a portion having a narrow width in the X direction other than the protrusion. The gate interconnect layer 11 has a narrow width in the X direction at the protrusion of the second opening 15, and has a wide width in the X direction at the other portion.

If the width in the X direction of the second opening 15 is made uniformly wide in the Y direction, then in conformity therewith, the width in the X direction of the gate interconnect layer 11 needs to be made uniformly narrow in the Y direction. As a result, the traveling distance of avalanche-generated holes in the p-type base layer 3 is made shorter, and the parasitic transistor is less likely to be turned on. However, the problem is that the gate resistance of the gate interconnect layer 11 increases. To avoid this, in the embodiment, the spacing in the X direction between the second opening 15 and the second trench 6 is distributed in the Y direction as described above so that the depression of the gate interconnect layer 11 is formed opposite to the protrusion of the second opening 15. That is, in the protrusion of the second opening, the traveling distance of avalanche-generated holes in the p-type base layer 3 is made shorter, and turn-on of the parasitic transistor is suppressed. Simultaneously, in the portion of the second opening 15 other than the protrusion, the increase of gate resistance in the Y direction of the gate interconnect layer is suppressed. Furthermore, the width in the Y direction of the gate interconnect layer 11 in the portion connected with the gate extraction portion 8a is wider than the gate extraction portion 8a. This structure reduces the gate resistance in the Y direction of the gate interconnect layer 11, and simultaneously reduces the gate resistance to the gate extraction portion 8a.

In the above description of the example of the semiconductor device 100 according to the embodiment, a plurality of first trenches extending like stripes in the Y direction are formed along the X direction in the device region. A gate electrode 8 shaped like a stripe is buried in the first trench via the gate insulating film 7. However, the adjacent ones of the plurality of first trenches can be connected to each other by a plurality of trenches extending in the X direction. Then, the gate electrode buried in this first trench via the gate insulating film 7 can be formed in a lattice or staggered configuration. This also applies to the other embodiments described below.
(Second Embodiment)

Figure 2A:
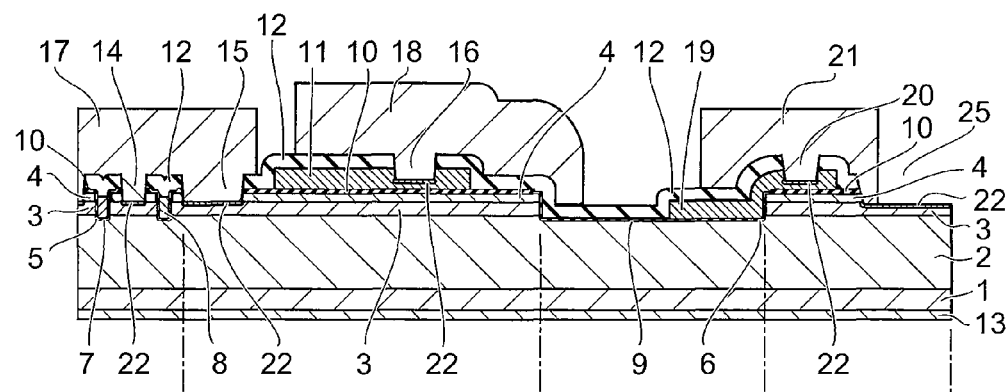
FIGS. 2A and 2B are schematic views of the main part of a semiconductor device according to a second embodiment.
Figure 2B:
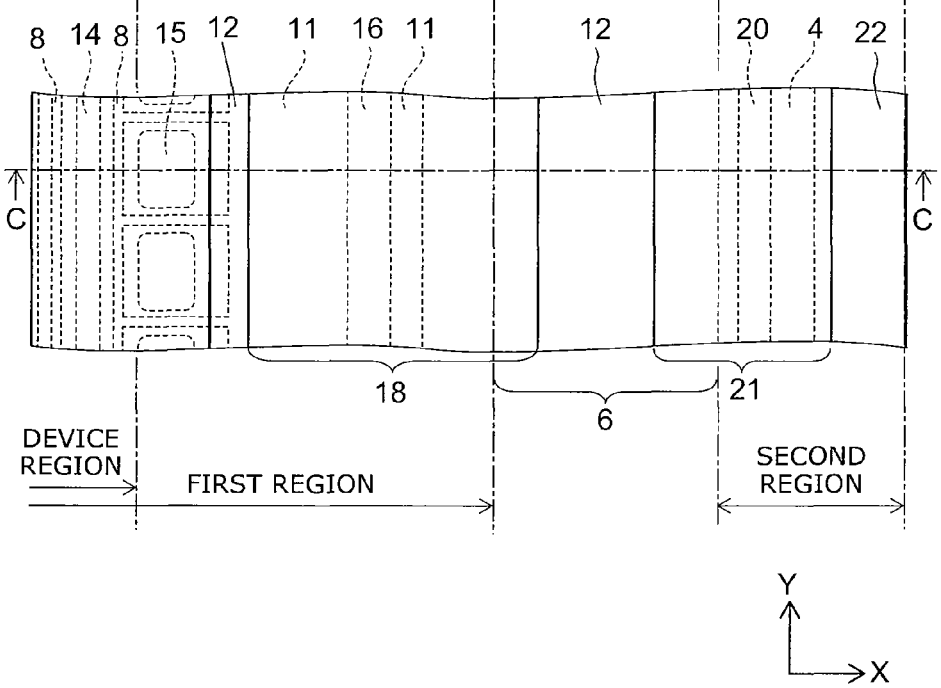

A semiconductor device 200 according to a second embodiment is described with reference to FIGS. 2A and 2B. FIGS. 2A and 2B are schematic views of the main part of the semiconductor device 200 according to the embodiment. More specifically, FIG. 2A is a sectional view of the main part of the semiconductor device 200. FIG. 2B is a top view of the main part of the semiconductor device. The cross section taken along line C-C of FIG. 2B is shown in FIG. 2A. The portions having the same configuration as those described in the first embodiment are labeled with like reference numerals or symbols, and the description thereof is omitted. Differences from the first embodiment are primarily described.

Like the first embodiment, in the semiconductor device 200 according to the second embodiment, the second opening 15 is formed from a plurality of divided portions spaced and separated along the Y direction. However, in the embodiment, the second opening 15 does not include a protrusion projected toward the second region in the X direction. Furthermore, the spacing in the X direction between the second opening 15 and the second trench 6 is constant along the Y direction. In conformity therewith, the width of the gate interconnect layer 11 is also uniform in the Y direction. In these points, the semiconductor device 200 according to the embodiment is different from the semiconductor device 100 according to the first embodiment.

Like the semiconductor device 100 according to the first embodiment, also in the semiconductor device 200 according to the embodiment, the second opening 15 located at the boundary between the device region and the termination region is formed so that the width of the second opening 15 in the X direction in the figure is wider than that of the first opening 14 in the device region. Thus, the spacing between the second opening 15 and the second trench 6 is narrowed. This reduces the distance traveled by avalanche-generated holes in the p-type base layer 3 between the second opening 15 and the second trench 6. Hence, turn-on of the parasitic transistor can be suppressed. This improves the avalanche withstand capability in the termination region, and can suppress device breakdown in the termination region. However, the width in the X direction of the second opening is made uniformly wide in the Y direction. In conformity therewith, the width in the X direction of the gate interconnect layer 11 is made uniformly narrow in the Y direction. As a result, the traveling distance of avalanche-generated holes in the p-type base layer 3 is made shorter, and turn-on of the parasitic transistor is suppressed. However, the problem is that the gate resistance of the gate interconnect layer 11 increases. In this point, the embodiment is inferior to the first embodiment.
(Third Embodiment)

Figure 3A:
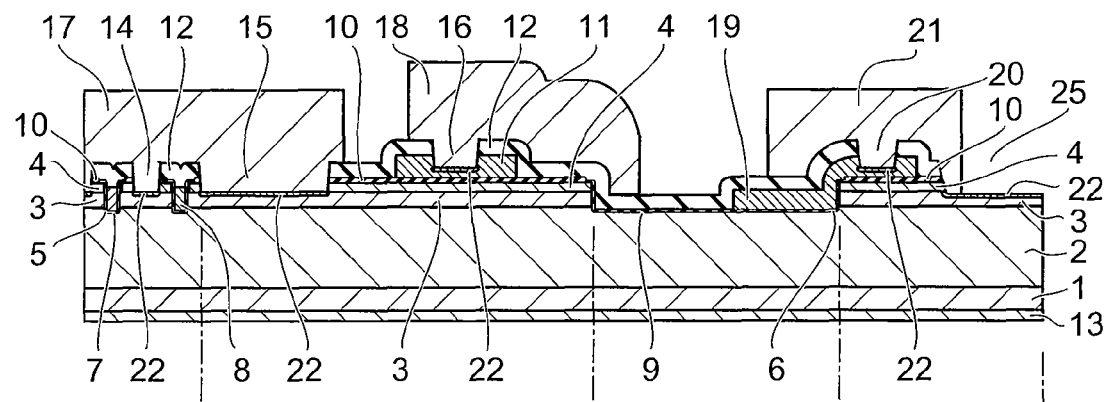
FIGS. 3A and 3B are schematic views of the main part of a semiconductor device according to a second embodiment.
Figure 3B:
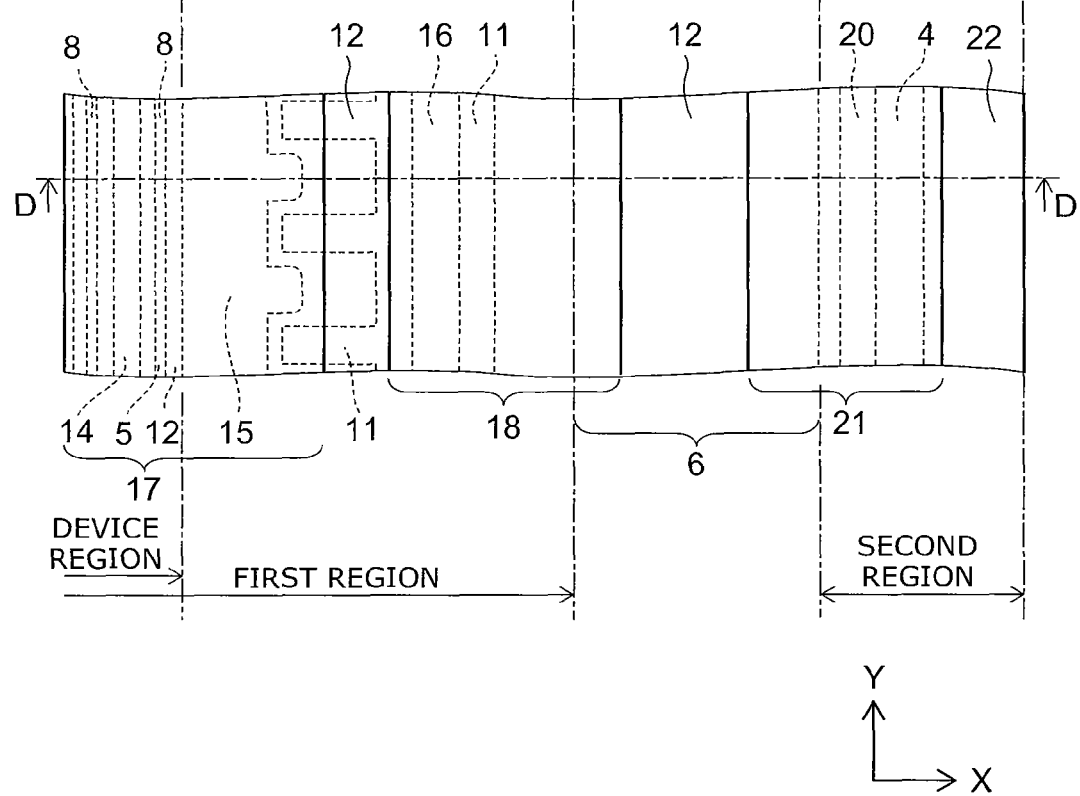

A semiconductor device 300 according to a third embodiment is described with reference to FIGS. 3A and 3B. FIGS. 3A and 3B are schematic views of the main part of the semiconductor device 300 according to the embodiment. More specifically, FIG. 3A is a sectional view of the main part of the semiconductor device 300. FIG. 3B is a top view of the main part of the semiconductor device. The cross section taken along line D-D of FIG. 3B is shown in FIG. 3A. The portions having the same configuration as those described in the first embodiment are labeled with like reference numerals or symbols, and the description thereof is omitted. Differences from the first embodiment are primarily described.

Like the semiconductor device 100 according to the first embodiment, in the semiconductor device 300 according to the third embodiment, the spacing in the X direction between the second opening 15 and the second trench 6 includes a wide portion and a narrow portion alternately along the Y direction. In conformity therewith, the gate interconnect layer 11 also includes, with regard to the width in the X direction, a wide portion and a narrow portion alternately along the Y direction. In the portion of narrow spacing in the X direction between the second opening 15 and the second trench 6, the second opening 15 includes a protrusion toward the second region in the X direction. In conformity with this protrusion, the gate interconnect layer 11 includes a depression recessed toward the second region in the X direction. Thus, the second opening 15 includes a portion having a wide width in the X direction due to the protrusion, and a portion having a narrow width other than the protrusion. The gate interconnect layer 11 has a narrow width in the X direction at the protrusion of the second opening 15, and has a wide width in the X direction at the portion other than the protrusion of the second opening 15. However, in the following points, the semiconductor device 300 is different from the semiconductor device 100 according to the first embodiment. The semiconductor device 300 according to the embodiment does not include a gate extraction portion 8a connecting the gate interconnect layer 11 with the gate electrode 8 formed in the first trench 5 adjacent to the gate interconnect layer 11. That is, the gate electrode 8 formed in the first trench 5 adjacent to the gate interconnect layer 11 only includes a striped shape extending in the Y direction. Furthermore, in the semiconductor device 300, the second opening 15 is not spaced and separated into a plurality along the Y direction, but is integrally formed.

Like the semiconductor device 100 according to the first embodiment, also in the semiconductor device 300 according to the embodiment, the second opening 15 located at the boundary between the device region and the termination region is formed so that the width of the second opening 15 in the X direction in the figure is wider than that of the first opening 14 in the device region. Thus, the spacing between the second opening 15 and the second trench 6 is narrowed. This reduces the distance traveled by avalanche-generated holes in the p-type base layer 3 between the second opening 15 and the second trench 6. Hence, turn-on of the parasitic transistor can be suppressed. This improves the avalanche withstand capability in the termination region, and can suppress device breakdown in the termination region. Furthermore, the spacing in the X direction between the second opening 15 and the second trench 6 is distributed in the Y direction as described above so that the depression of the gate interconnect layer 11 is formed opposite to the protrusion of the second opening 15. As a result, in the protrusion of the second opening, the traveling distance of avalanche-generated holes in the p-type base layer 3 is made even shorter, and turn-on of the parasitic transistor is suppressed. Simultaneously, in the portion of the second opening other than the protrusion, the increase of gate resistance in the Y direction of the gate interconnect layer is suppressed. However, the semiconductor device 300 according to the embodiment does not include a gate extraction portion 8a connecting the gate interconnect layer 11 with the first trench 5 adjacent to the gate interconnect layer 11. Hence, the gate resistance between the gate interconnect layer 11 and the first trench 5 adjacent thereto is made higher than in the semiconductor device 100 according to the first embodiment.

(Fourth Embodiment)

Figure 4A:
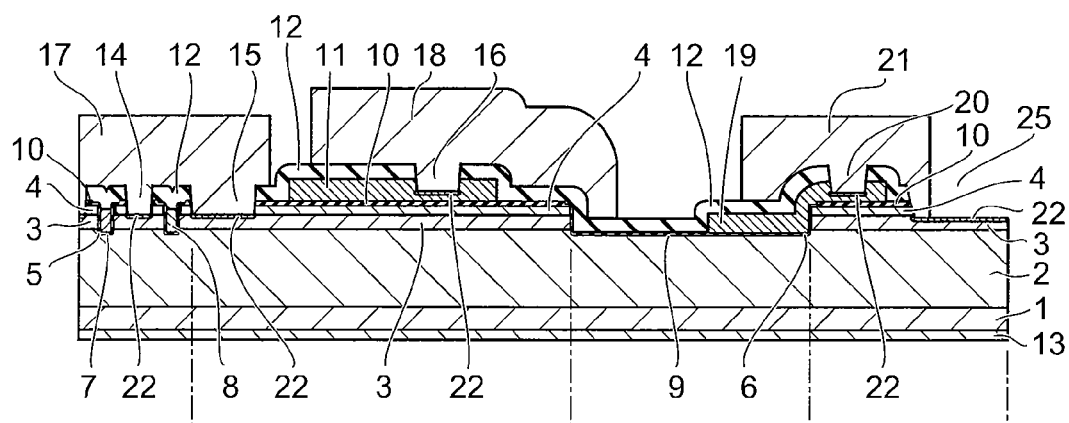
FIGS. 4A and 4B are schematic views of the main part of a semiconductor device according to a second embodiment.
Figure 4B:
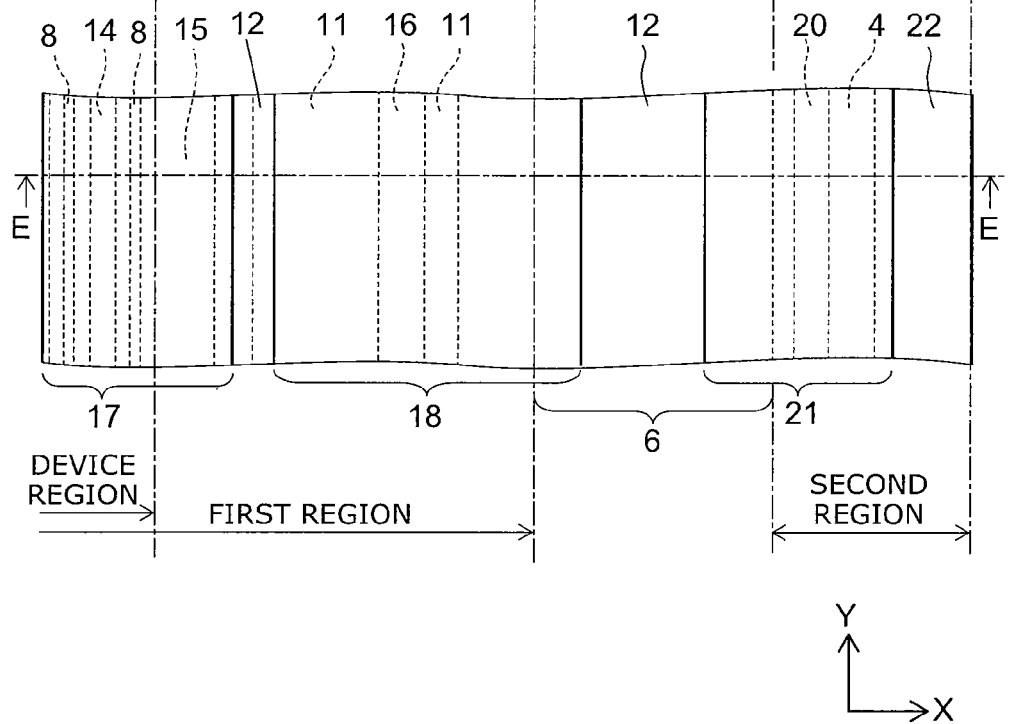

A semiconductor device 400 according to a fourth embodiment is described with reference to FIGS. 4A and 4B. FIGS. 4A and 4B are schematic views of the main part of the semiconductor device 400 according to the embodiment. More specifically, FIG. 4A is a sectional view of the main part of the semiconductor device 400. FIG. 4B is a top view of the main part of the semiconductor device. The cross section taken along line E-E of FIG. 4B is shown in FIG. 4A. The portions having the same configuration as those described in the first embodiment are labeled with like reference numerals or symbols, and the description thereof is omitted. Differences from the first embodiment are primarily described.

In the semiconductor device 400 according to the embodiment, the second opening 15 does not include a protrusion projected toward the second region in the X direction. The spacing in the X direction between the second opening 15 and the second trench 6 is constant along the Y direction. In conformity therewith, the width of the gate interconnect layer 11 is also uniform in the Y direction. Furthermore, the semiconductor device 400 does not include a gate extraction portion 8a connecting the gate interconnect layer 11 with the first trench 5 adjacent to the gate interconnect layer 11. In the semiconductor device 400, the second opening is not spaced and separated into a plurality along the Y direction, but is integrally formed. In these points, the semiconductor device 400 according to the embodiment is different from the semiconductor device 100 according to the first embodiment.

Like the semiconductor device 100 according to the first embodiment, also in the semiconductor device 400 according to the embodiment, the second opening 15 located at the boundary between the device region and the termination region is formed so that the width of the second opening 15 in the X direction in the figure is wider than that of the first opening 14 in the device region. Thus, the spacing between the second opening 15 and the second trench 6 is narrowed. This reduces the distance traveled by avalanche-generated holes in the p-type base layer 3 between the second opening 15 and the second trench 6. Hence, turn-on of the parasitic transistor can be suppressed. This improves the avalanche withstand capability in the termination region, and can suppress device breakdown in the termination region.

However, the width in the X direction of the second opening 15 is made uniformly wide in the Y direction. In conformity therewith, the width in the X direction of the gate interconnect layer 11 is made uniformly narrow in the Y direction. As a result, the traveling distance of avalanche-generated holes in the p-type base layer 3 is made shorter, and turn-on of the parasitic transistor is suppressed. However, the problem is that the gate resistance of the gate interconnect layer 11 increases. In this point, the embodiment is inferior to the first embodiment.

(Fifth Embodiment)

Figure 5A:
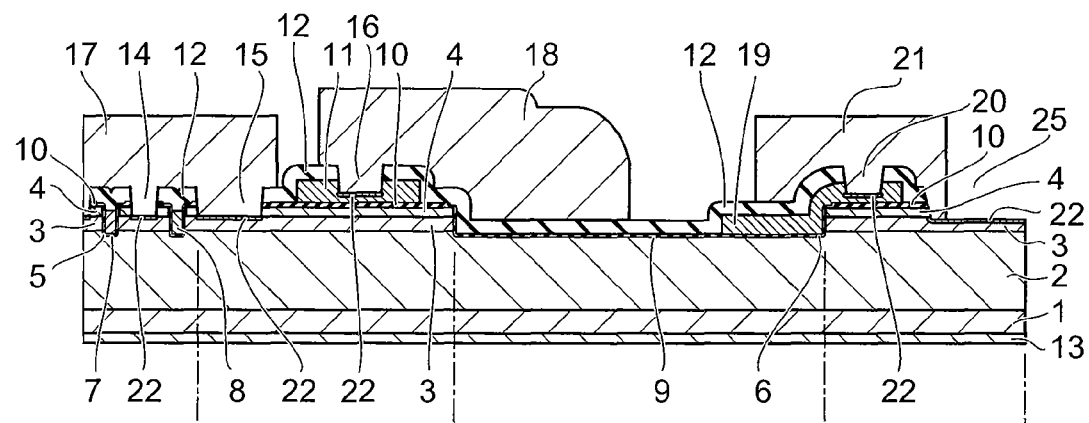
FIGS. 5A and 5B are schematic views of the main part of a semiconductor device according to a second embodiment.
Figure 5B:
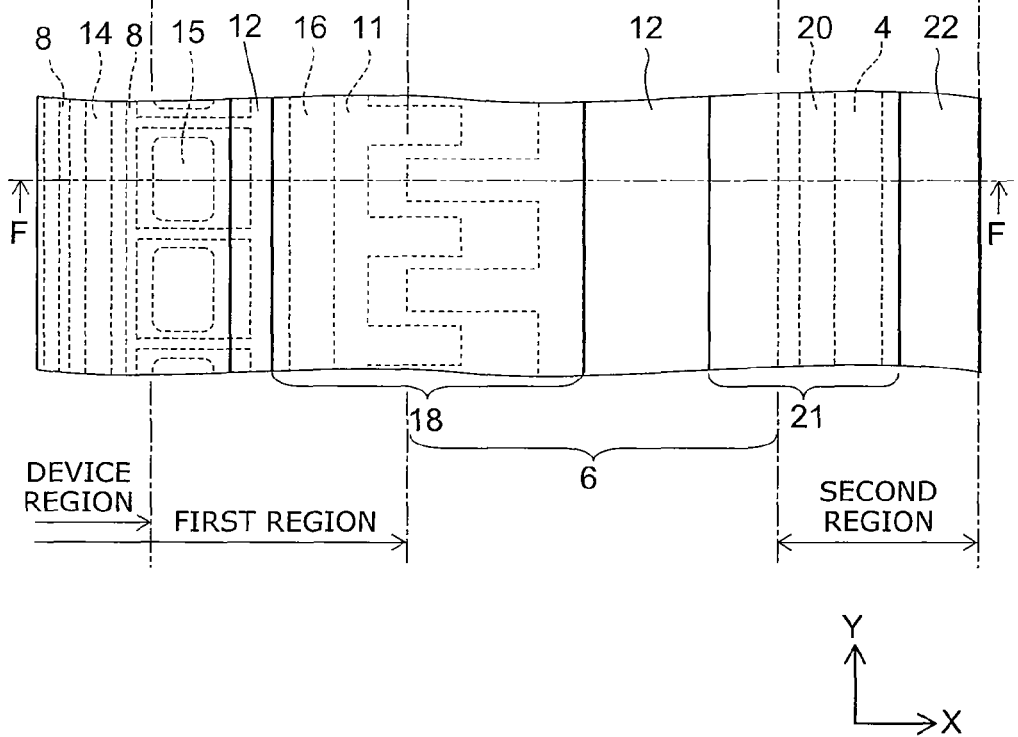

A semiconductor device 500 according to a fifth embodiment is described with reference to FIGS. 5A and 5B. FIGS. 5A and 5B are schematic views of the main part of the semiconductor device 500 according to the embodiment. More specifically, FIG. 5A is a sectional view of the main part of the semiconductor device 500. FIG. 5B is a top view of the main part of the semiconductor device. The cross section taken along line F-F of FIG. 5B is shown in FIG. 5A. The portions having the same configuration as those described in the first embodiment are labeled with like reference numerals or symbols, and the description thereof is omitted. Differences from the first embodiment are primarily described.

Like the semiconductor device 100 according to the first embodiment, in the semiconductor device 500 according to the fifth embodiment, the spacing in the X direction between the second opening 15 and the second trench 6 includes a wide portion and a narrow portion alternately along the Y direction. In conformity therewith, the gate interconnect layer 11 also includes, with regard to the width in the X direction, a wide portion and a narrow portion alternately along the Y direction. However, in the following points, the semiconductor device 500 is different from the semiconductor device 100 according to the first embodiment. In the portion of narrow spacing between the second opening 15 and the second trench 6 in the X direction, the second trench 6 includes a protrusion toward the device region in the X direction. In conformity with this protrusion, the gate interconnect layer 11 includes a depression recessed toward the device region in the X direction. Thus, the second trench 6 includes a portion having a wide width in the X direction of the protrusion, and a portion having a narrow width in the X direction other than the protrusion. The gate interconnect layer 11 has a narrow width in the X direction at the protrusion of the second trench 6, and has a wide width in the X direction at the portion other than the protrusion of the second trench 6. Furthermore, as in the semiconductor device 100 according to the first embodiment, the second opening 15 is divided into a plurality along the Y direction, and the width in the X direction is made wider than that of the first opening 14 in the device region. However, the semiconductor device 500 is different from the semiconductor device 100 in that the width in the X direction is uniform along the Y direction.

Like the semiconductor device 100 according to the first embodiment, also in the semiconductor device 500 according to the embodiment, the second opening 15 located at the boundary between the device region and the termination region is formed so that the width of the second opening 15 in the X direction in the figure is wider than that of the first opening 14 in the device region. Thus, the spacing between the second opening 15 and the second trench 6 is narrowed. This reduces the distance traveled by avalanche-generated holes in the p-type base layer 3 between the second opening 15 and the second trench 6. Hence, turn-on of the parasitic transistor can be suppressed. This improves the avalanche withstand capability in the termination region, and can suppress device breakdown in the termination region. Furthermore, the spacing in the X direction between the second opening 15 and the second trench 6 is distributed in the Y direction as described above so that the depression of the gate interconnect layer 11 is formed opposite to the protrusion of the second trench 6. As a result, in the protrusion of the second trench 6, the traveling distance of avalanche-generated holes in the p-type base layer 3 is made even shorter, and turn-on of the parasitic transistor is suppressed. Simultaneously, in the portion of the second trench 6 other than the protrusion, the increase of gate resistance in the Y direction of the gate interconnect layer is suppressed.

(Sixth Embodiment)

Figure 6A:
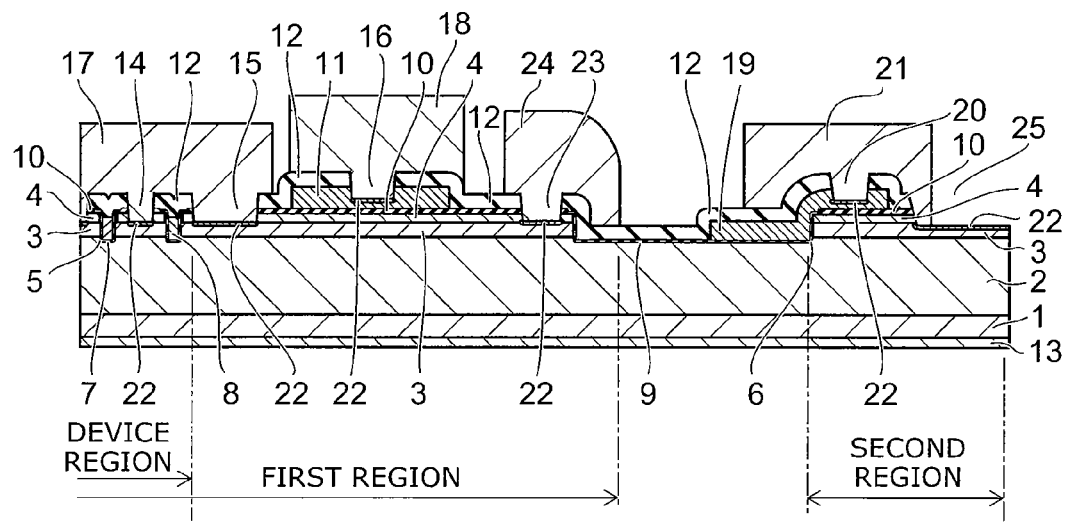
FIGS. 6A and 6B are schematic views of the main part of a semiconductor device according to a second embodiment.
Figure 6B:
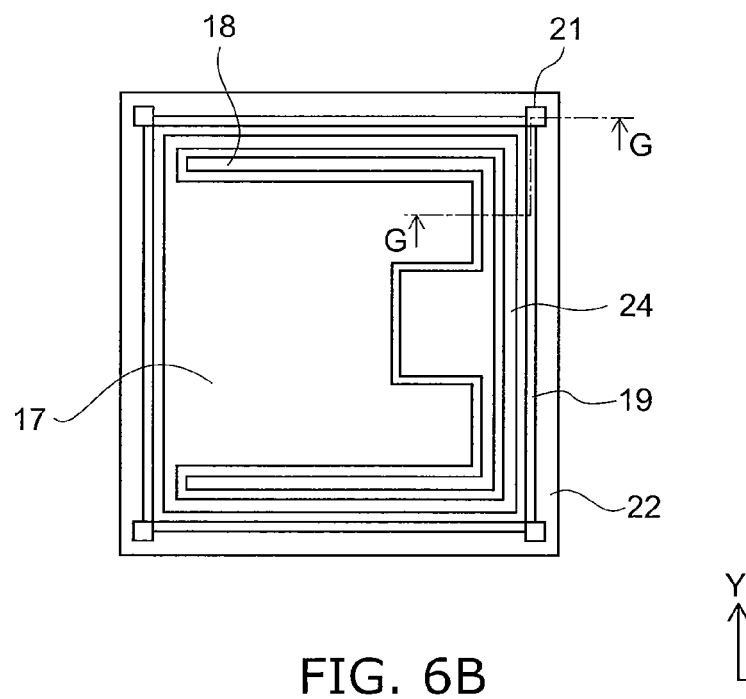

A semiconductor device 600 according to a sixth embodiment is described with reference to FIGS. 6A and 6B. FIGS. 6A and 6B are schematic views of the main part of the semiconductor device 600 according to the embodiment. More specifically, FIG. 6A is a sectional view of the main part of the semiconductor device 600. FIG. 6B is a top view of the chip of the semiconductor device 600. The cross section taken along line G-G of FIG. 6B is shown in FIG. 6A. The portions having the same configuration as those described in the first embodiment are labeled with like reference numerals or symbols, and the description thereof is omitted. Unless otherwise specified, the structure is the same as that of the semiconductor device 100 according to the first embodiment. The semiconductor device 600 of the embodiment described below also includes the gate electrode 8, first opening 14, second opening 15, gate interconnect layer 11, and second trench 6 having the same structure as those in the semiconductor device 100. Hence, the top view of the main part as shown in FIG. 1B is omitted. Differences from the first embodiment are primarily described.

In the following points, the semiconductor device 600 according to the embodiment is different from the semiconductor device 100 according to the first embodiment. In the first region, the semiconductor device 600 further includes a trench-shaped third opening 23 between the second trench 6 and the gate interconnect layer 11. The third opening 23 penetrates through the interlayer insulating film 12, the third insulating film 10, and the n$^+$-type source layer 4 to the p-type base layer 3. As in the first opening 14 and the second opening 15, a p$^+$-type contact layer 22 is provided on the surface of the p-type base layer 3 exposed at the third opening 23.

The gate metal interconnect layer 18 does not extend to the second trench, but is located on the device region side of the aforementioned third opening. A field plate electrode 24 made of the same metal material as the source electrode 17 forms ohmic contact with the p$^+$-type contact layer 22 through the third opening 23, and is electrically connected to the p-type base layer 3. Furthermore, the field plate electrode 24 is formed on the interlayer insulating film 12 so as to be connected to the source electrode 17 and to extend from the third opening 23 to the second trench 6. The field plate electrode 24 can be formed integrally with the source electrode 17. Thus, the field plate electrode 24 is formed on the interlayer insulating film 12 from the third opening 23 to the second trench 6 so as to cover the step difference at the boundary between the first region and the second trench 6.

Hence, the end portion of the depletion layer is extended from the step difference at the boundary between the first region and the second trench 6 toward the second region. This improves the breakdown voltage in the termination region.

The third opening 23 only needs to be formed like a stripe along the gate interconnect layer 11 or the gate metal interconnect layer 18 in the Y direction in the figure. However, the third opening 23 may be formed not only in the Y direction, but also in the X direction along the gate metal interconnect layer 18 formed along the X direction at the upper and lower end of the chip. That is, the third opening 23 may be formed continuously in the X and Y direction while being spaced along the gate metal interconnect layer 18.

Except the foregoing, the semiconductor device 600 has the same structure as the semiconductor device 100. Here, the plan view of FIG. 6B shows a planar pattern of the source electrode 17, the gate metal interconnect layer 18, the field plate electrode 24, and the channel stopper electrode 21. However, this is illustrative only, and other planar patterns can be used as necessary.

As described above, the semiconductor device 600 according to the embodiment further includes, besides the second opening 15, a third opening 23 in the first region. The third opening 23 is opposed to the second opening 15 across the gate interconnect layer 11. Like the second opening 15, the third opening 23 has the function of ejecting, when avalanche occurs, avalanche-generated holes from the third opening 23 through the field plate electrode 24 to the source electrode 17. In the semiconductor device 100 according to the first embodiment, holes generated by avalanche immediately below the gate interconnect layer 11 are ejected only from the second opening 15. Thus, the distance in the p-type base layer 3 traveled by holes in the X direction is, at the maximum, nearly equal to the spacing in the X direction between the second opening 15 and the second trench 6. In contrast, in the semiconductor device 600 according to the embodiment, avalanche-generated holes can be ejected from the second opening 15 on the device region side of the gate interconnect layer 11, and from the third opening on the second region side. Hence, in the semiconductor device 600, the distance in the p-type base layer 3 traveled by holes in the X direction is, even at the maximum, nearly equal to half the spacing in the X direction between the second opening 15 and the second trench 6. Thus, the semiconductor device 600 can further suppress turn-on of the parasitic transistor relative to the semiconductor device 100. Hence, the semiconductor device 600 achieves high avalanche withstand capability in the termination region, and high reliability.

The embodiment has been described in the case where the semiconductor device 600 includes the gate electrode 8, first opening 14, second opening 15, gate interconnect layer 11, and second trench 6 of the first embodiment. However, the embodiment is not limited thereto. Naturally, the third opening 23 of the embodiment can be combined with the semiconductor device of the second to fifth embodiments.

Furthermore, the first to fourth embodiments can be combined with the fifth embodiment. The first to sixth embodiments described above can be practiced in combination with each other as necessary.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
a first semiconductor layer of a first conductivity type;
a second semiconductor layer of the first conductivity type provided on the first semiconductor layer and having a lower first conductivity type impurity concentration than the first semiconductor layer;
a third semiconductor layer of a second conductivity type provided on the second semiconductor layer;
a fourth semiconductor layer of the first conductivity type provided on the third semiconductor layer and having a higher first conductivity type impurity concentration than the second semiconductor layer;
a first insulating film provided on an inner wall of each of a plurality of first trenches, the first trenches penetrating through the fourth semiconductor layer and the third semiconductor layer to the second semiconductor layer and extending in a first direction parallel to a surface of the first semiconductor layer;
a gate electrode buried in the each of the plurality of first trenches via the first insulating film;
a second insulating film provided on an inner wall of a second trench having a ring-shaped structure, the second trench penetrating through the fourth semiconductor layer and the third semiconductor layer to the second semiconductor layer and including a portion extending in the first direction, the portion dividing each of the third semiconductor layer and the fourth semiconductor layer between a first region and a second region, the first region including a device region inside, the device region including the gate electrode in a plurality, and the second region surrounding the first region outside;
a third insulating film provided on the fourth semiconductor layer in the first region and the second region, connected to the first insulating film and the second insulating film, and insulating the fourth semiconductor layer from outside;
a gate interconnect layer provided on the third insulating film in the first region, surrounding the device region, and electrically connected to the gate electrode at both ends of the each of the first trenches;
an interlayer insulating film provided on the gate electrode, the gate interconnect layer, the second trench, and the third insulating film and insulating the gate electrode and the gate interconnect layer from outside;
a first electrode provided on a surface of the first semiconductor layer opposite to the second semiconductor layer; and
a second electrode electrically connected to the third semiconductor layer and the fourth semiconductor layer through a first opening and a second opening, the first opening penetrating through the interlayer insulating film, the third insulating film, and the fourth semiconductor layer between adjacent ones of the first trenches, and the second opening penetrating through the interlayer insulating film, the third insulating film, and the fourth semiconductor layer and extending in the first direction between the gate interconnect layer and one of the plurality of first trenches adjacent to the gate interconnect layer in a second direction orthogonal to the first direction,
in the second direction, width of the second opening being wider than width of the first opening.

2. The device according to claim 1, wherein
the second opening includes a plurality of divided portions spaced and separated along the first direction,
the gate electrode further includes a gate extraction portion spaced from one of the divided portions of the second opening on each of both sides of the one of the divided portions in the first direction and buried via the first insulating film in a portion of the one of the plurality of first trenches adjacent to the gate interconnect layer, the portion extending toward the gate interconnect layer, and
the gate extraction portion is electrically connected to the gate interconnect layer.

3. The device according to claim 2, wherein spacing between the second opening and the second trench in the second direction includes a wide portion and a narrow portion alternately along the first direction, and the gate extraction portion is electrically connected to the gate interconnect layer in the wide portion.

4. The device according to claim 3, wherein in the narrow portion of the spacing between the second opening and the second trench in the second direction, the second opening includes a protrusion projected toward the second region, and the gate interconnect layer includes a depression recessed toward the second region.

5. The device according to claim 4, wherein a tip of the protrusion of the second opening projected toward the second region is provided nearer to the second region than an end portion of the gate interconnect layer on a side of the device region in the second direction.

6. The device according to claim 3, wherein in the narrow portion of the spacing between the second opening and the second trench in the second direction, the second trench includes a protrusion projected toward the device region, and the gate interconnect layer includes a depression recessed toward the device region.

7. The device according to claim 6, wherein a tip of the protrusion of the second trench projected toward the device region is provided nearer to the device region than an end portion of the gate interconnect layer on a side of the second region in the second direction.

8. The device according to claim 1, wherein spacing between the second opening and the second trench in the second direction includes a wide portion and a narrow portion alternately along the first direction.

9. The device according to claim 8, wherein in the narrow portion of the spacing between the second opening and the second trench in the second direction, the second opening includes a protrusion projected toward the second region, and the gate interconnect layer includes a depression recessed toward the second region.

10. The device according to claim 9, wherein a tip of the protrusion of the second opening projected toward the second region is provided nearer to the second region than an end portion of the gate interconnect layer on a side of the device region in the second direction.

11. The device according to claim 8, wherein in the narrow portion of the spacing between the second opening and the second trench in the second direction, the second trench includes a protrusion projected toward the device region, and the gate interconnect layer includes a depression recessed toward the device region.

12. The device according to claim 11, wherein a tip of the protrusion of the second trench projected toward the device region is provided nearer to the device region than an end portion of the gate interconnect layer on a side of the second region in the second direction.

13. The device according to claim 1, further comprising:
a field plate electrode electrically connected to the third semiconductor layer and the fourth semiconductor layer through a third opening, the third opening penetrating through the interlayer insulating film, the third insulating film, and the fourth semiconductor layer in the first region on a side of the second region of the gate interconnect layer, and the field plate electrode being electrically connected to the second electrode.

14. The device according to claim 13, wherein the third opening is formed continuously along the gate interconnect layer.

15. The device according to claim 13, wherein the field plate electrode covers the third insulating film and the second insulating film from the third opening to bottom of the second trench.

16. The device according to claim 13, wherein
the second opening includes a plurality of divided portions spaced and separated along the first direction,
the gate electrode further includes a gate extraction portion spaced from one of the divided portions of the second opening on each of both sides of the one of the divided portions in the first direction and buried via the first insulating film in a portion of the one of the plurality of first trenches adjacent to the gate interconnect layer, the portion extending toward the gate interconnect layer, and
the gate extraction portion is electrically connected to the gate interconnect layer.

17. The device according to claim 16, wherein
spacing between the second opening and the second trench in the second direction includes a wide portion and a narrow portion alternately along the first direction,
in the wide portion, the gate extraction portion is electrically connected to the gate interconnect layer, and
in the narrow portion, the second opening includes a protrusion projected toward the second region, and the gate interconnect layer includes a depression recessed toward the second region.

18. The device according to claim 13, wherein spacing between the second opening and the second trench in the second direction includes a wide portion and a narrow portion alternately along the first direction.

19. The device according to claim 18, wherein in the narrow portion of the spacing between the second opening and the second trench in the second direction, the second opening includes a protrusion projected toward the second region, and the gate interconnect layer includes a depression recessed toward the second region.

20. The device according to claim 1, wherein
adjacent ones of the plurality of first trenches are connected by a plurality of trenches extending in the second direction, and
the gate electrode is provided in a lattice or staggered configuration.

* * * * *